United States Patent
Kufer et al.

[11] Patent Number: 6,073,203
[45] Date of Patent: Jun. 6, 2000

[54] METHOD FOR THE CONTINUOUS READOUT OF A DATA SEQUENCE FROM A MEMORY

[75] Inventors: Wolfgang Kufer, Muehldorf; Wolfgang Kernchen, Sauerlich, both of Germany

[73] Assignee: Rohde & Schwarz GmbH & Co. KG, Munich, Germany

[21] Appl. No.: 08/984,622

[22] Filed: Dec. 3, 1997

[30] Foreign Application Priority Data

Dec. 11, 1996 [DE] Germany ............... 195 51 412

[51] Int. Cl.7 .................................... G06F 12/06
[52] U.S. Cl. ................. 711/5; 711/106; 711/157; 711/173; 711/168; 365/222; 365/230.03
[58] Field of Search ................. 711/5, 173, 157, 711/168, 106; 365/230.03, 222; 710/53

[56] References Cited

U.S. PATENT DOCUMENTS

| | | | |
|---|---|---|---|
| 5,161,221 | 11/1992 | Van Nostrand | 711/157 |
| 5,206,944 | 4/1993 | Pilkenton | 711/5 |
| 5,265,231 | 11/1993 | Nuwayser | 711/106 |
| 5,274,788 | 12/1993 | Koike | 711/157 |
| 5,561,784 | 10/1996 | Chen et al. | 711/157 |
| 5,572,691 | 11/1996 | Koudmani | 711/5 |
| 5,706,407 | 1/1998 | Nakamura | 395/86 |

OTHER PUBLICATIONS

Fast DRAMs Can Be Swapped For SRAM Caches, Bursky, Electronic Design 22, Jul. 22, 1996, pp. 55–70.

*Primary Examiner*—Hiep T. Nguyen
*Attorney, Agent, or Firm*—Hill & Simpson

[57] ABSTRACT

For the continuous and interruption-free readout of a data sequence predetermined by a predetermined address sequence from a memory that is constructed of dynamic memory components (DRAM or SDRAM) and that is divided into a number of separately addressable memory banks, the control circuit controlling the readout of the data sequence from the memory cells is operated, and the distribution of the data in the memory cells of the banks is selected, such that another bank is respectively refreshed during the readout of data from one of the banks. The memory contains at least three memory banks and the sequence of the bank addresses is always selected such that, given access to a bank, at least the access onto the preceding bank did not exhibit the same bank address.

2 Claims, 1 Drawing Sheet

METHOD FOR THE CONTINUOUS READOUT OF A DATA SEQUENCE FROM A MEMORY

BACKGROUND OF THE INVENTION

1. Field of the Invention

The invention is directed to a method for the continuous and interruption-free readout of a data sequence from a memory, the memory being of a type having a number of separately addressable memory banks.

2. Description of the Prior Art

There are numerous applications in digital technology in which a continuous digital data stream must be generated, for example in the case of a digital word generator or a so-called ARB signal generator, from which the data stream is subsequently supplied to a digital-to-analog converter. The data to be supplied as an output are usually generated either on a computer or read in via an interface and stored in an output memory. They are then read out from this memory with a desired clock rate.

Hitherto, such output memories have usually been implemented as static memories, known as SRAMs. Such memories have the disadvantages that they are not as highly integrated as the otherwise standard dynamic memories (DRAMs) and that they are relatively expensive for larger datasets.

Dynamic memories are not suitable for the continuous readout of a data stream since they cyclically require a refresh. If this refresh is omitted, the memories lose their contents. The refresh lasts longer than a normal memory access. This is the reason that a continuous and uninterrupted data stream, whose speed or rate lies on the order of magnitude of the access time, cannot be generated with such dynamic memories. For this reason, such dynamic memories have been employed only in computers wherein the program execution is cyclically interrupted, and thus there is time for a refresh of the entire memory.

This is also true of a known memory arrangement that operates with synchronous dynamic memory elements (SDRAM) (Bursky, "Fast Drams Can Be Swapped For Sram Caches", Electronic Design 22, Jul. 22, 1996, pages 55 to 70). Such a memory is divided into two separate memory banks, and the control circuit that controls the readout of the data sequence from the memory cells of the two memory banks is fashioned such that another bank is refreshed during the readout of data from one of the banks. This known memory, however, also requires a pause having the length of a clock at the sequence end, since the refresh of the other bank is not yet completed at the end of the access to the one bank (FIG. 5, page 64, pause between Dn8 and Qp1 in the aforementioned Electronic Design article). Thus, a continuous and interruption-free readout of a data sequence is also not possible with this known memory.

SUMMARY OF THE INVENTION

It is an object of the present invention to provide a method and an arrangement for the continuous and uninterrupted readout of a data sequence from a memory that avoids these disadvantages, and which employ low-cost dynamic memory components that exhibit a small space requirement.

The above object is achieved in accordance with the principles of the present invention in a method for the readout of a data sequence which is predetermined by an address sequence from a memory constructed of dynamic memory components (DRAM or SDRAM), the memory being divided into at least three memory banks and each memory bank having a separate bank address allocated thereto and containing a number of memory cells, in which the data of the data sequence are stored, the memory cells being defined by column addresses and row addresses, with readout of the data taking place so that while data is being read from one of the memory banks, another of the memory banks is being refreshed, with the sequence of the bank addresses being selected so that, at all times, when one memory bank is being accessed, access at least to the preceding bank did not exhibit the same bank address.

In the inventive method, standard dynamic memory components (DRAMs or SDRAMs) can also be utilized for generating a continuous, uninterrupted data stream since the division into individual banks and the manner of control by the control circuit assure that all memory cells of the individual banks receive a refresh in time at the maximum clock rate.

DESCRIPTION OF THE PREFERRED EMBODIMENTS

Figures 1, 2:
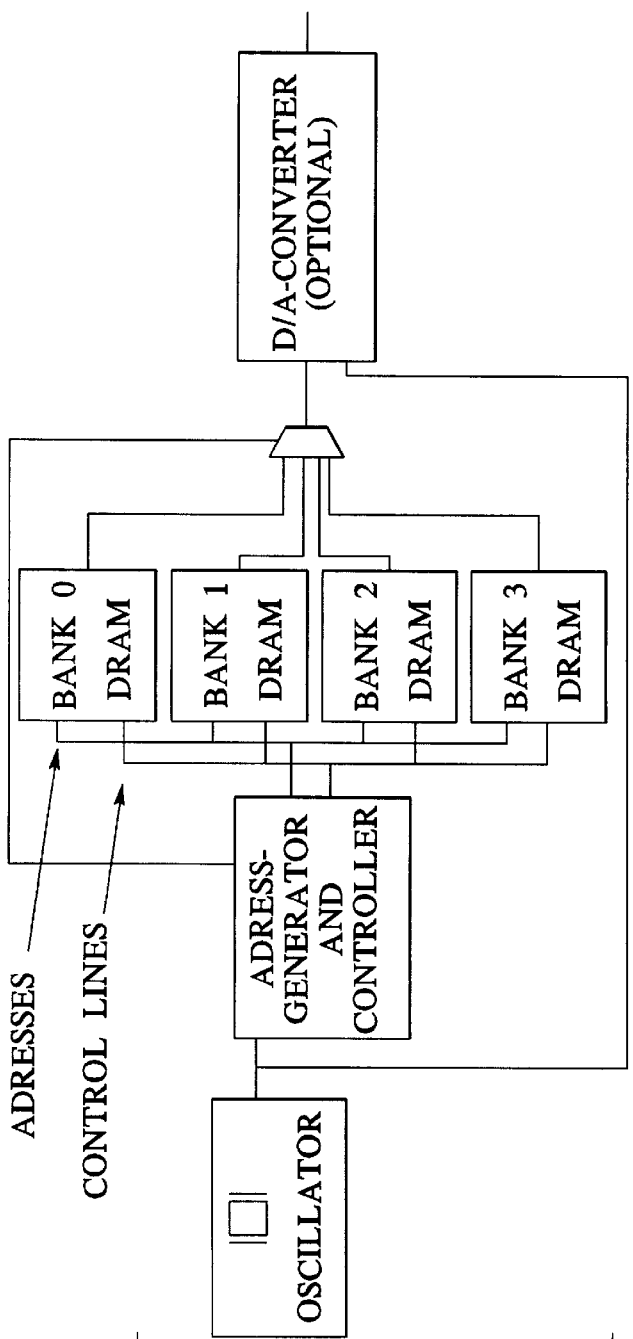
FIG. 1 is a block diagram of a memory and an arrangement for reading out the memory in a continuous, interruption-free manner in accordance with the invention.
FIG. 2 schematically illustrates an address sequence for reading out the memory shown in FIG. 1 in accordance with the invention.

FIG. 1 shows the block circuit diagram of a digital memory for the continuous and uninterrupted readout of a predetermined data sequence in accordance with the invention. In the illustrated example, the memory is composed of four dynamic memories DRAM that are controlled via an address sequence of a controller shown in FIG. 2. In the illustrated exemplary embodiment, thus, the overall memory is divided into four mutually separate banks 0,1,2,3. Again controlled by the controller, the data sequences read out from the DRAMs are merged to form a continuous data stream and, for example, are supplied to a digital-to-analog converter and are emitted at the output thereof.

According to the address sequence of FIG. 2, the successive memory addresses with which the desired data sequence is defined respectively reside in different banks of the overall memory. The controller causes with incrementing addresses the bank to be read out which has the next address. For example, the data sets 0,1,2 and 3 of the data sequence are stored in four memory cells in the row RAS 0 and the column CAS 0 of the bank 0. When, thus, the bank 0 having the row 0 and the column 0 is interrogated via the controller, the first four data sets 0,1,2,3 of the data sequence are read out. A refresh REF is then subsequently implemented for the bank 0. The row RAS 0 and column CAS 0 of the bank 1 are interrogated with the next address while the bank 1 is still being accessed, and the data sets 4,5,6 and 7 stored therein are read out and merged with the data of the bank 0 to a form a continuous data stream. Subsequently, the bank 1 is then also refreshed (REF) in turn. The banks 2 and 3 are then successively read out in the same way. The same readout operation begins for the row 1 (RAS 1) after the readout of a total of 16 data sets; the readout of the next columns CAS 1,2 begins when all rows of the banks have been read out, etc. The delay between the RAS, CAS, DAT and REF and the number of data words is dependent on the memory type (DRAM or SDRAM) employed. It is advantageous to change the bank addresses first, then the row addresses and, finally, the column addresses since all memory cells can thereby be refreshed in time.

By employing at least three memory banks—even four successive memory banks in the illustrated exemplary embodiment—it is assured that a bank completely refreshed when it is accessed. In order to also assure this at the sequence end, the controller is programmed such that, under all possible circumstances when accessing a bank, neither the predecessor bank nor the bank preceding the predecessor bank have the same bank address. It is thus assured that, at the end of the memory, a new beginning can be seamlessly made at the front under all circumstances.

The four banks are again interrogated in the sequence 0-1-2-3. The stored sequence length is prescribed by the user. The address sequence is also determined in advance. The sequence length should be divisible in increments of whole bursts.

There are then at least the following four, specific cases:
First Case:
The sequence length is divisible by 4 without remainder.
In this case, the banks at the sequence end are addressed in the following sequence:

Start:                End: |Start:
    0-1-2-3-0-...-1-2-3-0-1-2-3-0-1-2-3-0-1-2-3-0-...

This case can be continuously processed.
Second Case:
The sequence length is divisible by 4 with a remainder of 1.
The following bank sequence would occur without special measures at the sequence end:

Start:                End: |Start:
    0-1-2-3-0-...-1-2-3-0-1-2-3-0-0-1-2-3-0-...

A two-time access to the same bank is not possible without an intervening pause, and thus the goal of a continuous data output is not achieved. At the sequence end, the banks are therefore addressed in the following sequence:

Start:                End: |Start:
    0-1-2-3-0-...-1-2-3-0-2-3-1-2-0-1-2-3-0-...

Third Case:
The sequence length is divisible by 4 with a remainder of 2.
Without special measures at the sequence end, the following bank sequence would occur:

Start:                End: |Start:
    0-1-2-3-0-...-1-2-3-0-1-2-3-0-1-0-1-2-3-0-...

A two-time access onto the same bank with only one bank between is not possible without an intervening pause and thus the goal of a continuous data output is not achieved. Instead, the banks at the sequence end are addressed in the following sequence:

Start:                End: |Start:
    0-1-2-3-0-...-1-2-3-0-1-2-3-1-2-0-1-2-3-0-...

Fourth Case
The sequence length is divisible by 4 with a remainder of 3.
The following bank sequence derives at the sequence end:

Start:                End: |Start:
    0-1-2-3-0-...-1-2-3-0-1-2-3-0-1-2-0-1-2-3-0-...

This case can be continuously processed.
In cases 2 and 3, thus, the data at the sequence end are not deposited at their normal location of the corresponding memory bank, as in the preceding banks. At the sequence end, it is therefore necessary to store those data in the memory cells of this last sequenced bank that are no longer interrogated in the normal sequence, at correspondingly different memory cells (determined by column addresses and row addresses), so that the correct data are also read out in turn at the sequence end. This is possible given this type of predetermined data sequence since, of course, the address sequence for the data is likewise predetermined.

In addition to the aforementioned four cases, of course, other memory bank sequences at the sequence end are also conceivable dependent on the number of memory banks employed. Given more than four banks, the situation at the sequence end noticeably becomes easier. Using modern SDRAM memory components, a continuous operation could also be realized with only three memory banks insofar as these enable a bank sequence of 0-1-0-1-0-1.

When the overall memory in the sense of the exemplary embodiment of FIG. 1 is composed of a number of banks that are respectively implemented as separate components (chips), the refresh (REF) during the readout of data from the other banks can be implemented for the entire bank being refreshed. When, however, the individual banks are accommodated in the same component, it is expedient—after the readout of the data from a bank—to refresh the respective row of this bank during the readout of the data from the next bank, i.e. to respectively implement the refresh of the banks row-by-row.

Even higher output rates can be achieved when SDRAMs are respectively used for the individual banks.

Although various minor modifications might be suggested by those skilled in the art, it should be understood that we wish to embody within the scope of the patent warranted hereon all such modifications as reasonably and properly come with the scope of our contribution to the art.

We claim as our invention:

1. A method for readout of a data sequence comprising the steps of:

providing a memory having at least three memory banks, each memory bank having a separate bank address allocated thereto and each memory bank containing a plurality of memory cells defined by column addresses and row addresses;

storing data in a data sequence in said memory cells of said at least three memory banks; and controlling readout of said data sequence from said memory cells by selecting one of said at least three memory banks for current readout of data therefrom while refreshing a previously read out bank of said at least three memory banks, and continuously reading out said data sequence without interruptions by always selecting a sequence of said bank addresses so that the bank addresses for a current readout bank is different from an address of an immediately preceding bank which was read out.

2. A method as claimed in claim 1 wherein the step of providing a memory includes providing a memory having at least four of said memory banks, and selecting a sequence of bank addresses for continuous readout of said data sequence wherein the address of the bank being currently read out is different both from the address of an immediately preceding bank which was readout, and a bank immediately preceding said bank immediately preceding the current being read out.

* * * * *